(12) United States Patent  (10) Patent No.: US 9,086,754 B2
Tong  (45) Date of Patent: Jul. 21, 2015

(54) SIMULATED HARDWARE BUTTON OPERATION METHOD AND TOUCH SCREEN TERMINAL

(71) Applicant: Huawei Device Co., Ltd., Shenzhen, Guangdong (CN)

(72) Inventor: Deli Tong, Beijing (CN)

(73) Assignee: Huawei Device Co., Ltd., Shenzhen (CN)

(*) Notice: Subject to any disclaimer, the term of this patent is extended or adjusted under 35 U.S.C. 154(b) by 217 days.

(21) Appl. No.: 13/728,180

(22) Filed: Dec. 27, 2012

(65) Prior Publication Data
US 2013/0127762 A1 May 23, 2013

Related U.S. Application Data

(63) Continuation of application No. PCT/CN2011/081460, filed on Oct. 28, 2011.

(30) Foreign Application Priority Data

Nov. 5, 2010 (CN) .......................... 2010 1 0533412

(51) Int. Cl.
G06F 3/041 (2006.01)
G06F 3/045 (2006.01)
H03K 17/96 (2006.01)

(52) U.S. Cl.
CPC .............. G06F 3/0412 (2013.01); H03K 17/96 (2013.01)

(58) Field of Classification Search
CPC . G06F 3/04883; G06F 3/044; G06F 3/04886; G06F 3/041; G06F 3/0488; G06F 3/0412; G06F 3/0416; G06F 3/0414; G06F 3/043; G06F 3/0436; G02F 1/13338
See application file for complete search history.

(56) References Cited

U.S. PATENT DOCUMENTS 6,720,952 B1 4/2004 Takizawa et al.
7,932,839 B2 4/2011 Ko et al.
(Continued)

FOREIGN PATENT DOCUMENTS

CN 101187845 A 5/2008
CN 101498979 A 8/2009
(Continued)

OTHER PUBLICATIONS

International Search Report in corresponding PCT Patent Application No. PCT/CN2011/081460 (Jan. 12, 2012).
(Continued)

*Primary Examiner* — Alexander Eisen
*Assistant Examiner* — Nan-Ying Yang
(74) *Attorney, Agent, or Firm* — Huawei Device Co., Ltd.

(57) ABSTRACT

Disclosed are a simulation hardware button operation method and a touch screen terminal. In the touch screen terminal, the network node of at least one pixel in the upper boundary region of a touch screen is arranged on the inner side surface of the terminal housing outside of the touch screen, and when a detection reporting unit detects a touch sensing unit sensing through the network node an user operating the touch button of the terminal, the detection reporting unit reports the corresponding pixel information of the sensed network node; an operation confirmation unit confirms the function of the operation to the touch button by the user according to the report of the detection reporting unit. Thus the location of the simulation hardware button of the touch screen terminal can be flexibly arranged at any location on the housing of the terminal outside of the touch screen.

12 Claims, 3 Drawing Sheets

(56) References Cited

U.S. PATENT DOCUMENTS

| | | | |
|---|---|---|---|
| 2003/0222857 A1* | 12/2003 | Abileah | 345/173 |
| 2008/0055260 A1 | 3/2008 | Posamentier | |
| 2008/0218535 A1* | 9/2008 | Forstall et al. | 345/690 |
| 2009/0008234 A1 | 1/2009 | Tolbert et al. | |
| 2009/0184937 A1 | 7/2009 | Grivna | |
| 2009/0189867 A1* | 7/2009 | Krah et al. | 345/173 |
| 2010/0188363 A1 | 7/2010 | Ikeda et al. | |
| 2010/0265190 A1 | 10/2010 | Rofougaran | |
| 2011/0227847 A1* | 9/2011 | Yoshiyama | 345/173 |
| 2011/0234527 A1 | 9/2011 | Borges et al. | |

FOREIGN PATENT DOCUMENTS

| | | |
|---|---|---|
| CN | 101634935 A | 1/2010 |
| CN | 101739190 A | 6/2010 |
| CN | 101866237 A | 10/2010 |
| CN | 101984392 A | 3/2011 |
| DE | 102008004423 A1 | 7/2009 |
| DE | 102009009954 A1 | 8/2010 |
| DE | 102010010806 A1 | 9/2011 |
| EP | 0597753 A1 | 5/1994 |
| JP | H10-113969 A | 5/1998 |
| JP | 2005084982 A | 3/2005 |
| JP | 2010176328 A | 8/2010 |
| KR | 100700143 B1 | 3/2007 |
| KR | 20100087861 A | 8/2010 |

OTHER PUBLICATIONS

Chinese Search Report in corresponding Chinese Patent Application No. 201010533412.3 (Oct. 20, 2011).

Extended European Search Report in corresponding European Patent Application No. 11837548.4 (Mar. 7, 2013).

* cited by examiner

SIMULATED HARDWARE BUTTON OPERATION METHOD AND TOUCH SCREEN TERMINAL

CROSS-REFERENCE TO RELATED APPLICATION

This application is a continuation of International Patent Application No. PCT/CN2011/081460, filed on Oct. 28, 2011, which claims priority to Chinese Patent Application No. 201010533412.3 filed on Nov. 5, 2010, both of which are hereby incorporated by reference in the entireties.

FIELD OF THE INVENTION

The present invention relates to the field of electronic information technologies, and in particular, to a method for operating a simulated hardware button and a touch screen terminal.

BACKGROUND OF THE INVENTION

Nowadays, touch screen terminals such as mobile phone are developing rapidly and are easy for a user to use. As shown in FIG. 1, the touchable interface of an existing touch screen terminal includes a liquid crystal display (LCD) screen 1 and a non-display touchable region 2, wherein the non-display touchable region 2 includes a simulated hardware button 3.

A user may operate the touch screen terminal by touching the LCD screen 1 and the simulated hardware button 3. The terminal can sense a point touched by the user and confirm the operation on the terminal by the user according to the pixel information of the sensed touch point and the correspondence relationship between the pixel information of the touch point and the operating function.

The location of the simulated hardware button 3 in the existing touch screen terminal is fixed, and a non-display touchable region 2 is needed to concentratedly arrange the simulated hardware buttons 3.

SUMMARY OF THE INVENTION

The embodiments of the invention provide a method for operating a simulated hardware button, and a touch screen terminal; thereby a layout of simulated hardware buttons can be flexible.

An embodiment of the invention provides a touch screen terminal, including: a touch sensing unit, a detection reporting unit and an operation confirmation unit, wherein:

the touch sensing unit comprises a touch screen and network nodes, each pixel point on the touch screen corresponds to one of the network node s, and the network nodes are connected to form a cage circuit, wherein a network node corresponding to at least one pixel point in a boundary region of the touch screen is arranged on an inner side surface of a terminal housing outside the touch screen;

the touch sensing unit is configured to sense a user operation on a touch button of the terminal through the network node, wherein the touch button of the terminal is arranged at a location corresponding to the network node on the other side of the touch screen and on an outer side surface of the terminal housing;

the detection reporting unit is configured to report pixel point information corresponding to the network node sensed when it is detected that the network node in the touch sensing unit senses the user operation on the touch button of the terminal; and the operation confirmation unit is configured to determine a function of the user operation on the touch button of the terminal according to the pixel point information reported by the detection reporting unit and a correspondence relationship between the pixel point information and a touch button operating function.

An embodiment of the invention further provides a method for operating a simulated hardware button, including:

arranging a network node corresponding to at least one pixel point of a boundary region of a touch screen on an inner side surface of a terminal housing outside the touch screen;

sensing a user operation on a simulated hardware button of a terminal through the network node of at least one pixel point in the boundary region, wherein the simulated hardware button is on a location corresponding to the network node on an outer side surface of the terminal housing;

reporting boundary-region pixel point information corresponding to the network node sensed; and performing a touch button operating function corresponding to the boundary-region pixel point information according to the boundary-region pixel point information reported and a correspondence relationship between the pixel point information and the touch button operating function.

In the touch screen terminal according to the embodiment of the invention, the network node of at least one pixel point in the boundary region of the touch screen is arranged on the inner side surface of the terminal housing outside the touch screen. When the detection reporting unit detects that the touch sensing unit senses through the network node the user operation on a touch button of the terminal, the detection reporting unit reports the pixel point information corresponding to the network node sensed. The operation confirmation unit confirms the function of the operation on the touch button of the terminal by the user according to the report of the detection reporting unit. In this embodiment, the location of the simulated hardware button of the touch screen terminal is not restricted, and the simulated hardware button may be flexibly arranged at any location on the terminal housing outside the touch screen, rather than being concentratedly arranged in a dedicated non-display touchable region.

BRIEF DESCRIPTION OF THE DRAWINGS

In order to more clearly illustrate the technical solutions of the embodiments of the invention or of the prior art, the drawings needed in the description of the embodiments or the prior art will be briefly introduced below. Apparently, the drawings in the description below are only some embodiments of the invention, and other drawings may also be obtained by one of ordinary skills in the art according to these drawings without creative work.

DETAILED DESCRIPTION OF THE EMBODIMENTS

The technical solutions in the embodiments of the invention will be described clearly and fully below in conjunction with the drawings in the embodiments of the invention. Apparently, the embodiments described are only a part of the embodiments of the invention, rather than being the whole embodiments. All the other embodiments obtained by one of ordinary skills in the art based on the embodiments of the invention without creative work pertain to the protection scope of the invention.

Device Embodiment

Figure 1:
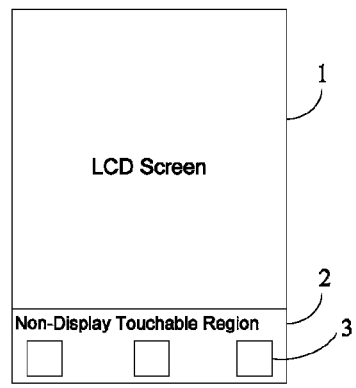
FIG. 1 is a schematic structural diagram of the touchable interface of an existing touch screen terminal.
Figure 2:
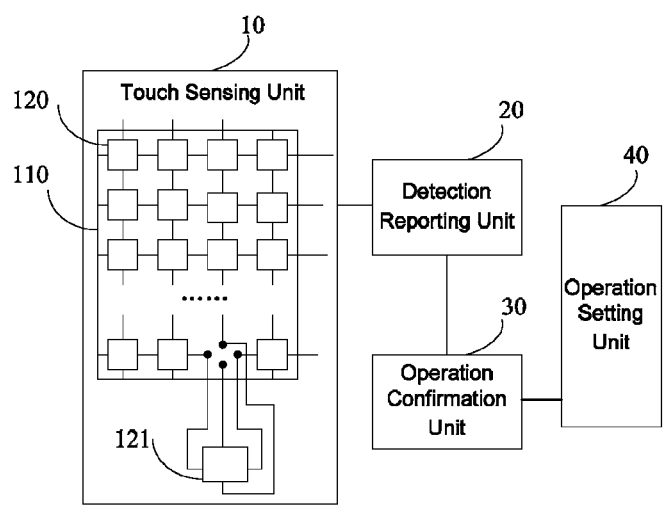
FIG. 2 is a schematic structural diagram of the touch screen terminal according to a device embodiment of the invention.

A touch screen terminal, the schematic structural diagram of which is shown in FIG. 2, includes: a touch sensing unit 10, a detection reporting unit 20 and an operation confirmation unit 30, wherein:

The touch sensing unit 10 includes a touch screen 110 and a network node 120, each pixel point on the touch screen 110 is corresponding to a network node 120, and these network nodes 120 are connected to form a cage circuit, wherein a network node 121 corresponding to at least one pixel point (for example, illustrated by one pixel point in the drawing) in the boundary region of the touch screen 110 is arrange on the inner side surface of the terminal housing outside the touch screen 110.

It may be understood that, here, the network node 121 may be arranged at any place on the inner side surface of the terminal housing outside the touch screen 110, wherein the place may be the inner side surface of the lateral housing or the inner side surface of the back housing, and the specific location is not restricted. However, for easy use, when leaving the factory, the network node 121 may be arranged on the inner side surface of the front housing, for example, near the touch screen 110, so that the operation of the user is convenient. Moreover, the boundary region of the touch screen 110 may be a region in a certain distance such as 1 mm from the boundary of the touch screen 110, and the specific size of the boundary region may be determined by the terminal manufacturer according to various factors such as the actual size and the operating function of the touch screen 110, etc.

It should be understood that here, when it is said that a network node corresponds to a pixel point, it not only refers to a location correspondence relationship, but also comprises a logic function correspondence relationship.

The touch sensing unit 10 is adapted to sense the user operation on the touch button of the terminal through the network node.

Here, the network node 120 is arranged on one side of the touch screen 110, and the location on the other side of the touch screen 110 corresponding to the network node 120 is the location of the touch button of the terminal screen. The network node 121 is arranged on the inner side surface of the terminal housing, and the location on the outer side surface of the terminal housing corresponding to the network node 121 is the location of the touch button of the terminal. Such button is not in the screen, but is a simulated hardware button, for providing a shortcut operation on the terminal, for example, operations such as hanging up, dialing up, directioning and photographing, etc., and one pixel point in the boundary region may correspond to one simulated hardware button, or a plurality of pixel points in the boundary region may correspond to one simulated hardware button.

It may be understood that, the touch screen 110 included in the touch sensing unit 10 may be an LCD screen, and the network node 120 corresponding to the pixel point as well as the network node 121 corresponding to the boundary region pixel point may include a piezoresistor or a capacitor, etc., or other pressure sensors that may sense the click operation of the user with respect to the touch button.

The detection reporting unit 20 is adapted to report the pixel point information corresponding to the network node sensed when it is detected that the network node in the touch sensing unit 10 senses the operation of the user with respect to the touch button of the terminal.

Specifically, during detection, the detection reporting unit 20 may detect whether the state parameter of the network node in the touch sensing unit 10 meets a preset condition. If the state parameter meets the preset condition, it may be regarded that the user performs an operation via the touch button of the terminal. Here, the preset condition may include any of the following information: the variation of the state parameter exceeds a threshold K, i.e., a preset value; the attribute information of the network node obtained according to the state parameter changes, etc. Wherein, the state parameter of the network node is the state of the network node in the cage circuit, for example, parameters such as voltage and current, or the inherent attribute parameter of the network node, for example, parameters such as resistance. For example, when the detection reporting unit 20 detects that the voltage variation on both sides of the piezoresistor exceeds a threshold or detects that the resistance of the piezoresistor changes, it is detected that the network node senses the operation of the user.

When reporting the pixel point information, the detection reporting unit 20 may report information such as the coordinate of the pixel point in the touch screen.

In a specific embodiment, the detection reporting unit 20 may include a detecting unit and a reporting unit, wherein the detecting unit is adapted to detect whether the state parameter of the network node in the touch sensing unit 10 meets a preset condition; the reporting unit is adapted to report the pixel point information corresponding to the network node that is detected when the detecting unit detects that the state parameter of the network node in the touch sensing unit 10 meet the preset condition.

The operation confirmation unit 30 is adapted to determine the function of the user operation on the touch button of the terminal according to the pixel point information reported by the detection reporting unit 20 and the correspondence relationship between the pixel point information and the touch button operating function.

It may be understood that, the operation confirmation unit 30 may compare the pixel point information reported by the detection reporting unit 20 with the correspondence relationship between the pixel point information and the touch button operating function that is stored locally. If the pixel point information matches certain pixel point information in the correspondence relationship, the touch button operating function corresponding to the pixel point information is determined as the function of the user operation on the touch button of the terminal. In this embodiment, in the preset correspondence relationship in the touch screen terminal, the touch button operating function corresponding to the boundary pixel point information may be a shortcut operation on the terminal, for example, operations such as hanging up, dialing up, directioning and photographing.

Figure 3:
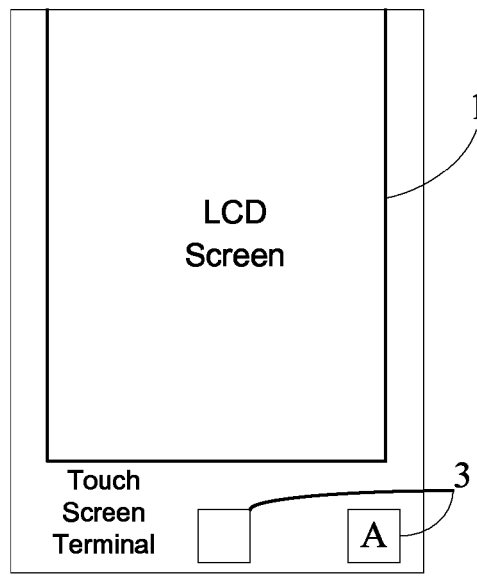
FIG. 3 is a schematic structural diagram of the touchable interface of a touch screen terminal according to an embodiment of the invention.

In the touch screen terminal according to an embodiment of the invention, the network node corresponding to at least one pixel point in the boundary region of the touch screen 110 is arranged on the inner side surface of the terminal housing outside the touch screen 110. When the detection reporting unit 20 detects that the touch sensing unit 10 senses through the network node the user operation on a touch button of the terminal, the detection reporting unit reports the pixel point information corresponding to the network node sensed. The operation confirmation unit 30 confirms the function of the user operation on the touch button of the terminal according to the report of the detection reporting unit 20. Referring to FIG. 3, the touchable interface of the touch screen terminal in this embodiment may include an LCD screen 1 and a simulated hardware button 3, wherein the simulated hardware button may be at any location on the terminal housing outside the screen.

The location of the simulated hardware button of the touch screen terminal in this embodiment is not restricted, and the simulated hardware button may be flexibly arranged at any location on the terminal housing outside the touch screen, rather than being concentratedly arranged in a dedicated non-display touchable region.

In a specific embodiment, the terminal according to the embodiment of the invention may further include an operation setting unit 40, for setting the correspondence relationship between the boundary-region pixel point information corresponding to the network node 121 arranged outside the touch screen 110 and the touch button operating function, and the operation confirmation unit 30 confirms the user operation according to the correspondence relationship set by the setting unit 40.

Specifically, the operation setting unit 40 may include a user interface display unit and a receiving and storing unit. When setting the correspondence relationship, the user interface display unit may first display a user interface to the user on the touch screen 110 of the terminal, wherein the user interface is adapted to enable a user to select or input the button operating function corresponding to the boundary region pixel point information. When the receiving and storing unit in the operation setting unit 40 receives a button operating function selected or input by the user via the user interface, the boundary-region pixel point information and the button operating function are stored correspondingly. Thus, the operation setting unit 40 sets a new correspondence relationship, the terminal in this embodiment provides a setting interface of the operating function of the simulated hardware button, i.e., the operation setting unit 40, to the user, and the user may set a convenient shortcut operating function via this unit.

In another specific embodiment, the implemented structures of the network nodes 120 and 121 corresponding to the pixel point of the touch screen are the same with each other, and both may include a first piezoresistor and a second piezoresistor, wherein the first piezoresistors of adjacent network nodes are laterally connected in series, and the second piezoresistors of adjacent network nodes are longitudinally connected in series.

When the detection reporting unit 20 detects that the resistance variation of the first piezoresistor and the second piezoresistor or the voltage variation or current variation of the first piezoresistor and the second piezoresistor exceeds a threshold, the detection reporting unit 20 detects that the network node senses the user operation on the touch button of the terminal, and reports the horizontal coordinate of the pixel point corresponding to the first piezoresistor in the touch screen and the longitudinal coordinate of the pixel point corresponding to the second piezoresistor in the touch screen.

It may be understood that, the resistances of the first piezoresistors laterally connected in series are different, and each resistance corresponds to the horizontal ordinate of a pixel point. If the resistance of one of the first piezoresistors connected in series changes, the detection reporting unit 20 may know in which region of the lateral screen the first piezoresistor exists according to the changed resistance, so that the horizontal coordinate in the touch screen may be obtained.

In this embodiment, a resistance-type touch screen terminal is employed, and the terminal senses the horizontal coordinate and longitudinal coordinate of the touch button operated by the user respectively via the two piezoresistors comprised in one network node, i.e., the first piezoresistor and the second piezoresistor.

In another specific embodiment, the network nodes 120 and 121 corresponding to the pixel point of the touch screen include a first capacitor and a second capacitor, the first capacitors of adjacent network nodes are laterally connected in series, and the second capacitors of the adjacent network nodes are longitudinally connected in series.

When the detection reporting unit 20 detects that the capacitance variation of the first capacitor and the second capacitor or the voltage variation or current variation of the first capacitor and the second capacitor exceeds a threshold, the detection reporting unit 20 detects that the network node senses the user operation on the touch button of the terminal, and reports the horizontal coordinate of the pixel point corresponding to the first capacitor in the touch screen and the longitudinal coordinate of the pixel point corresponding to the second capacitor in the touch screen.

In this embodiment, a capacitance-type touch screen terminal is employed. The terminal senses the horizontal coordinate and longitudinal coordinate of the touch button operated by the user respectively via the two capacitor comprised in one network node, i.e., the first capacitor and the second capacitor.

The above first and second are not representative of the order relation of the devices; instead, the above first and second indicate two different devices.

It may be understood that, in the embodiments of the invention, the touch screen terminal may be a mobile phone, a palmtop (PDA), a touch-type portable media player and a portable notebook computer.

In a specific embodiment, by taking the mobile phone as an example, the detection reporting unit 20 is specifically implemented via a touch screen chip, and the operation confirmation unit 30 is implemented via a central processing unit (CPU) and a button processing module, wherein:

The touch screen chip is adapted to report an interruption to the central processing unit when it is detected that the network node in the touch sensing unit 10 senses the user operation on the touch button of the terminal, wherein the interruption comprises the pixel point information corresponding to the network node sensed.

The central processing unit is adapted to send the pixel point information corresponding to the network node sensed to the button processing module according to the interruption reported by the touch screen chip.

The button processing module is adapted to match the pixel point information corresponding to the network node sensed with the correspondence relationship between the pixel point information and the touch button operating function that is stored, and determine the matched touch button operating function.

The device according to an embodiment of the invention will be illustrated by a specific application embodiment. In this embodiment, the boundary region of the screen of the touch screen terminal has two network nodes corresponding to the pixel point, the network nodes are arranged on locations outside the touch screen.

A user performs a click operation on a simulated hardware button A at the bottom right corner of the terminal as shown in FIG. 3. It may be understood that, the simulated hardware button A is at a location on the outer side surface of the housing outside the touch screen of the terminal, and the user operation on the terminal may be sensed by the network node a at a location corresponding to the simulated hardware button A on the inner side surface of the terminal housing. In this embodiment, the network node a is the network node corresponding to the pixel point in the boundary region of the touch screen. Here, corresponding means the corresponding of logic function.

When the touch screen chip detects that the state parameter of the network node a meets a preset condition, the touch screen chip reports the coordinate of the pixel point in the boundary region corresponding to the network node a, for example, [240, 320], to the CPU in an interruption. The CPU sends the coordinate information to the button processing module according to the content of the interruption. The button processing module compares the coordinate information with a preset coordinate in the terminal. There are two simulated hardware buttons in this embodiment, so there are two preset coordinates in the terminal. When [240, 320] matches one of the preset coordinates, the operating function corresponding to [240, 320], for example, a shortcut button for short message, is determined according to the coordinate of the pixel point in the boundary region and the operating function of the simulated hardware button. Thus the button processing module confirms that the user operation on the simulated hardware button A is to open short message information on the initial interface.

Figure 4:
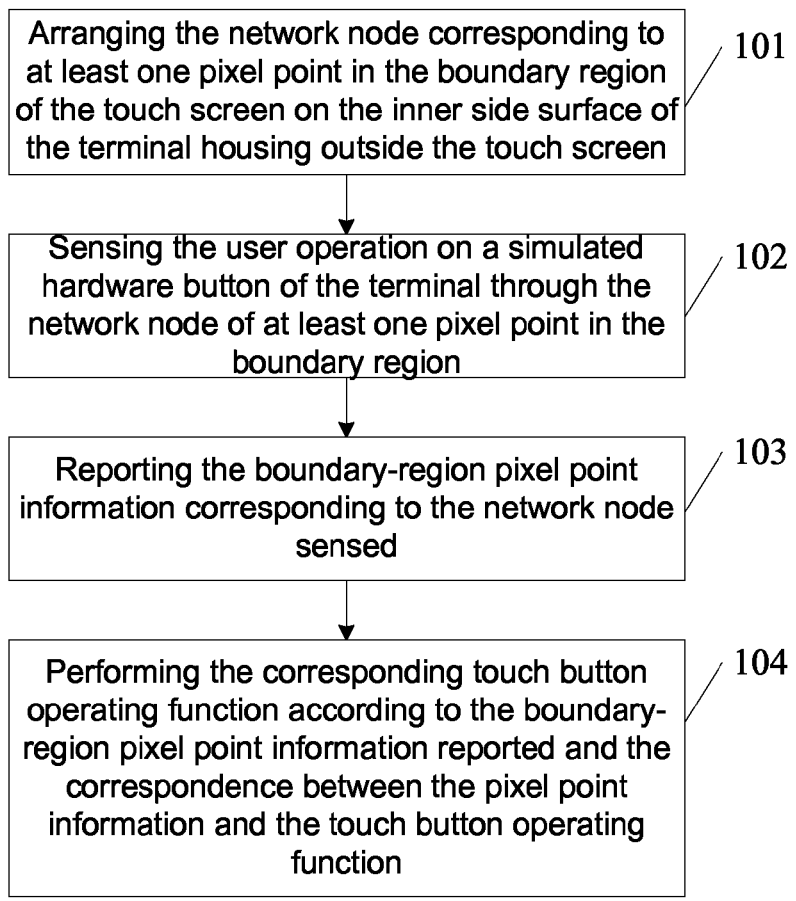
FIG. 4 is a flowchart of the method for the touch operation of a simulated hardware button according to an embodiment of the invention.

An embodiment of the invention further provides a method for operating a simulated hardware button, and the flowchart thereof is as shown in FIG. 4, which includes:

101: arranging a network node corresponding to at least one pixel point of a boundary region of a touch screen on an inner side surface of a terminal housing outside the touch screen.

It may be understood that, each pixel point of the touch screen in the mobile terminal corresponds to one network node, and these network nodes are connected to form a cage circuit as shown in FIG. 2, thus each network node in the cage circuit has at least four interfaces for connecting with other network nodes. In this embodiment, when the network node corresponding to at least one pixel point in the boundary region is arranged, the network node may be arranged on the inner side surface of the terminal housing outside the touch screen, and connection lines connected with the four interfaces of the network node in the cage circuit may be extended beyond the touch screen and connected with the network node arranged on the inner side surface of the terminal housing.

Here, the inner side surface of the terminal housing may refer to any place outside the touch screen, for example, an inner side surface of a front housing, an inner side surface of a back housing, or an inner side surface of a lateral housing, etc. Moreover, the boundary region of the touch screen refers to a region in a certain distance from the boundary of the touch screen.

102: sensing a user operation on a simulated hardware button of the terminal through the network node of at least one pixel point in the boundary region. Here, the simulated hardware button is at a location corresponding to the network node arranged on the outer side surface of the terminal housing.

Wherein, the network node may include a capacitor or a piezoresistor, or other pressure sensors that may sense the click operation on a touch button by a user. The touch button of the terminal includes a touch button inside the touch screen and a button corresponding to the network node arranged outside the touch screen. Such buttons are simulated hardware buttons, and are mainly used for some shortcut operation on the terminal, for example, shortcut operations such as short message editing and photographing.

103: reporting the boundary-region pixel point information corresponding to the network node sensed, such as the coordinate information of the pixel point in the boundary region.

104: performing the touch button operating function corresponding to the boundary-region pixel point information according to the boundary-region pixel point information reported and the correspondence relationship between the pixel point information and the touch button operating function.

In this embodiment, a correspondence relationship between the boundary-region pixel point information corresponding to the network node arranged outside the touch screen and the touch button operating function may also be set. Specifically, in this embodiment, the terminal may provide a setting interface of the operating function of the simulated hardware button to the user, and the user may set a convenient shortcut operating function via the setting interface.

Here, the touch button operating function in the correspondence relationship between the boundary-region pixel point information and the touch button operating function includes a simulated hardware button function, and the touch button operating function performed is the simulated hardware button function, for providing a shortcut operation on the terminal.

Figure 5:
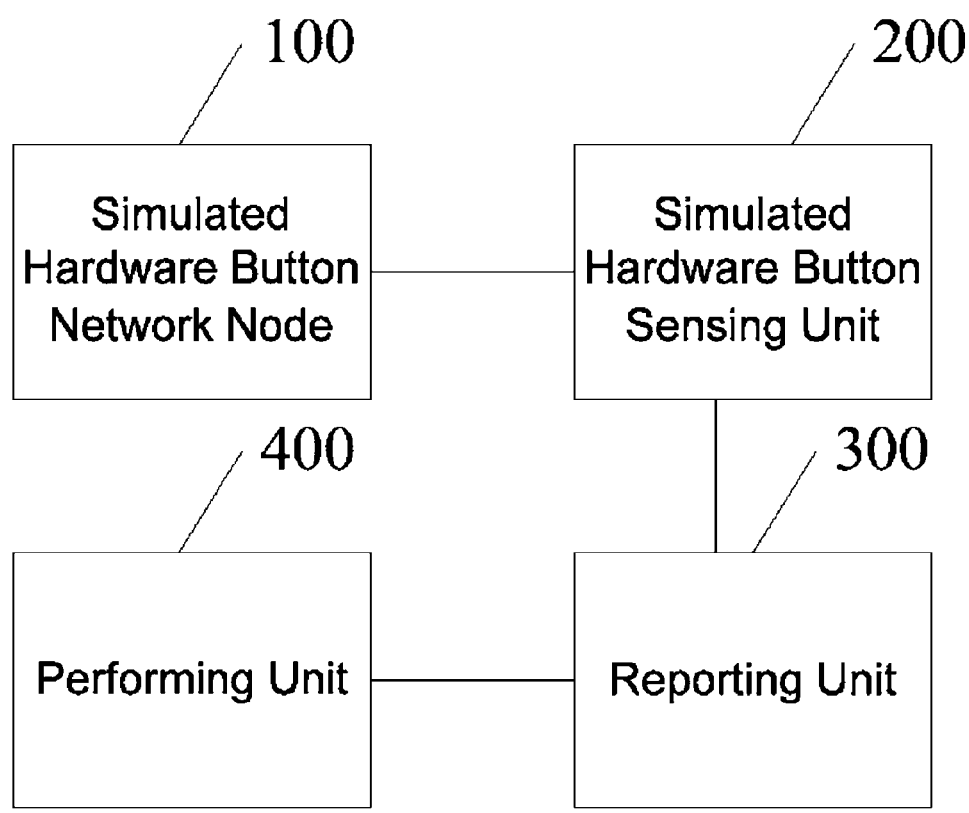
FIG. 5 is a structural schematic diagram of another touch screen terminal according to an embodiment of the invention.

An embodiment of the invention further provides a touch screen terminal, the structural schematic diagram of the touch screen terminal is as shown in FIG. 5, the touch screen terminal includes:

a simulated hardware button network node 100, for arranging the network node corresponding to at least one pixel point of the boundary region of the touch screen on the inner side surface of the terminal housing outside the touch screen;

a simulated hardware button sensing unit 200, adapted to sense a user operation on the simulated hardware button through the simulated hardware button network node 100, wherein the simulated hardware button is at a location corresponding to the network node arranged on the outer side surface of the terminal housing;

a reporting unit 300, adapted to report the boundary-region pixel point information corresponding to the simulated hardware button network node 100 that is sensed by the simulated hardware button sensing unit 200;

performing unit 400, adapted to perform the touch button operating function corresponding to the boundary-region pixel point information according to the boundary-region pixel point information reported by the reporting unit 300 and the correspondence relationship between the pixel point information and the simulated button network node operating function.

In conclusion, in the touch screen terminal according to the embodiments of the invention, the network node corresponding to at least one pixel point of the boundary region of the touch screen is arranged on the inner side surface of the terminal housing outside the touch screen, and when the detection reporting unit detects that the touch sensing unit senses through the network node the user operation on a touch button of the terminal, the detection reporting unit reports the pixel point information corresponding to the network node sensed. The operation confirmation unit confirms the function of the user operation on the touch button of the terminal according to the report of the detection reporting unit. Thus, the location of the simulated hardware button of the touch screen terminal is restricted, and the simulated hardware button may be flexibly arranged at any location on the terminal housing outside the touch screen, rather than being concentratedly arranged in a dedicated non-display touchable region.

The method for operating the simulated hardware button and the touch screen terminal according to the embodiments of the invention has been illustrated in detail above. Specific examples are employed here to explain the principles and implementation modes of the invention. The above illustration of the embodiments is only used for understanding the method of the invention and the core concept thereof. Meanwhile, modifications on the specific embodiments and the application range can be made by one of ordinary skills in the art according to the concept of the invention. Therefore, the contents of the specification should not be construed as limiting the scope of the invention.

What is claimed is:

1. A terminal, comprising:
a touch sensing unit, a detection reporting unit and an operation confirmation unit,
wherein:
the touch sensing unit comprises a touch screen having a plurality of pixel points, each pixel point corresponds to one of a plurality of network nodes, and the network nodes are interconnected to form a cage circuit; at least one network node, which corresponds to a pixel point at a boundary region of the touch screen, is arranged to be located outside the touch screen and connected with a touch button located outside the touch screen;
wherein:
the touch sensing unit is configured to sense a user operation on the touch button through the network node connected with the touch button;
the detection reporting unit is configured to report information of the pixel point corresponding to the network node connected with the touch button when the touch sensing unit senses the user operation on the touch button; and
the operation confirmation unit is configured to determine, according to the information of the pixel point, an operating function corresponding to the user operation on the touch button.

2. The terminal according to claim 1, wherein when reporting the information of the pixel point corresponding to the network node connected with the touch button, the detection reporting unit is configured to:
detect whether a state parameter of the network node connected with the touch button meets a preset condition, wherein the preset condition includes one or both of: (a) a variation of the state parameter exceeds a preset value, and (b) attribute information of the network node obtained according to the state parameter changes; and
report the information of the pixel point corresponding to the network node connected with the touch button when the state parameter of the network node meets the preset condition.

3. The terminal according to claim 1, wherein the information of the pixel point reported by the detection reporting unit comprises coordinate information of the pixel point in the touch screen.

4. The terminal according to claim 1, wherein the touch button is a simulated hardware button function, for providing a shortcut operation on the terminal.

5. The terminal according to claim 1, wherein the terminal further comprises:
an operation setting unit, configured to set a correspondence relationship between the information of the pixel point corresponding to the network node connected with the touch button and the operating function.

6. The terminal according to claim 5, wherein in setting the correspondence relationship between the information of the pixel point corresponding to the network node connected with the touch button and the operating function, the operation setting unit is configured to:
display a user interface on the touch screen, the user interface is configured to provide an interface for the user to select or input an operating function corresponding to the information of the pixel point; and
receive the operating function selected or input by the user via the user interface, and store the relationship between the information of the pixel point and the selected operating function.

7. The terminal according to claim 1, wherein the terminal is a mobile phone, the detection reporting unit is implemented by a touch screen chip, and the operation confirmation unit is implemented by a central processing unit (CPU);
wherein the touch screen chip is configured to report an interruption to the CPU when the touch sensing unit senses the user operation on the touch button connected with the network node corresponding to the pixel point, wherein the interruption includes the information of the pixel point corresponding to the network node;
wherein the CPU is configured to, according to the interruption reported by the touch screen chip match the information of the pixel point with the operating function as set in the correspondence relationship between the information of the pixel point and the operating function, and determine the operating function.

8. A method for implementing a simulated hardware button in a terminal, wherein the terminal comprises a touch sensing unit, a detection reporting unit and an operation confirmation unit; the touch sensing unit comprises a touch screen having a plurality of pixel points, each pixel point corresponds to one of a plurality of network nodes, and the network nodes are interconnected to form a cage circuit; at least one network node, which corresponds to a pixel point at a boundary region of the touch screen, is arranged to be located outside the touch screen and connected with a touch button located outside the touch screen;
the method comprising:
sensing a user operation on the touch button through the network node connected with the touch button;
reporting information of the pixel point corresponding to the network node connected with the touch button when the user operation on the touch button is sensed;
determining, according to the information of the pixel point, an operating function corresponding to the user operation on the touch button; and
performing the determined operating function.

9. The method according to claim 8, wherein the method further comprises:
setting a correspondence relationship between the information of the pixel point corresponding to the network node connected with the touch button and the operating function.

10. The method according to claim 8, wherein the touch button is a simulated hardware button for providing a shortcut operation on the terminal.

11. A mobile terminal, comprising a touch sensing assembly, a touch screen control chip, and a central processing unit (CPU);
wherein the touch sensing assembly comprises a touch screen unit having a plurality of pixel points, each pixel point corresponds to one of a plurality of network nodes, and the network nodes are interconnected to form a cage circuit; at least one network node, which corresponds to a pixel point at a boundary region of the touch screen unit, is arranged to be located outside the touch screen and connected with a simulated hardware button located outside the touch screen unit, wherein the touch screen control chip is configured to report an interruption to the CPU when the touch sensing assembly senses a user input on the simulated hardware button, wherein the interruption includes the information of the pixel point corresponding to the network node;

wherein the CPU is configured to, according to the interruption reported by the touch screen control chip, match the information of the pixel point with an operation function according to a correspondence relationship between the information of the pixel point and the operating function, and perform the operating function.

12. The method according to claim 11, wherein the operating function performed in response to the user input on the simulated hardware button is a shortcut operation on the terminal.

* * * * *